United States Patent
Kim et al.

(10) Patent No.: US 8,390,382 B2
(45) Date of Patent: Mar. 5, 2013

(54) POWER AMPLIFIER CIRCUIT

(75) Inventors: Ki Joong Kim, Jeollabuk-do (KR);
Youn Suk Kim, Gyunggi-do (KR);
Seong Geon Kim, Gyunggi-do (KR);
Jun Goo Won, Gyunggi-do (KR); Joong Jin Nam, Seoul (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 0 days.

(21) Appl. No.: 13/024,740

(22) Filed: Feb. 10, 2011

(65) Prior Publication Data
US 2012/0062325 A1 Mar. 15, 2012

(30) Foreign Application Priority Data
Sep. 14, 2010 (KR) ........................ 10-2010-0090081

(51) Int. Cl.
*H03F 3/00* (2006.01)
(52) U.S. Cl. .......................................... 330/307; 330/68
(58) Field of Classification Search ............... 330/68, 330/296–297, 252–261, 301–302
See application file for complete search history.

(56) References Cited

U.S. PATENT DOCUMENTS

| 7,088,971 | B2 * | 8/2006 | Burgener et al. | 455/127.1 |
| 7,764,125 | B2 * | 7/2010 | Dawe | 330/305 |
| 2008/0315954 | A1 | 12/2008 | Staszewski et al. | |

FOREIGN PATENT DOCUMENTS

| KR | 1020040054278 | 6/2004 |
| KR | 1020060071916 | 12/2004 |

OTHER PUBLICATIONS

Korean Office Action 10-2010-0090081 issued Jul. 28, 2011.

* cited by examiner

*Primary Examiner* — Hieu Nguyen
(74) *Attorney, Agent, or Firm* — Lowe Hauptman Ham & Berner, LLP

(57) ABSTRACT

There is provided a power amplifier circuit capable of improving cross isolation between a high frequency band power coupler and a low frequency band power coupler, by directly transmitting power to the high frequency band power coupler and the low frequency band power coupler from a power amplifier, and forming a predetermined inductance circuit or an LC resonance circuit in a line transmitting the power to the high frequency band power coupler. The power amplifier circuit may include a power amplifying unit supplied with power from the outside and amplifying an input signal, a coupling unit having a high frequency band power coupler and a low frequency band power coupler, and an isolation unit including a first power line and a second power line, wherein the first power line has an inductor blocking signal interference generated in a predetermined frequency band.

6 Claims, 8 Drawing Sheets

POWER AMPLIFIER CIRCUIT

CROSS-REFERENCE TO RELATED APPLICATIONS

This application claims the priority of Korean Patent Application No. 10-2010-0090081 filed on Sep. 14, 2010, in the Korean Intellectual Property Office, the disclosure of which is incorporated herein by reference.

BACKGROUND OF THE INVENTION

1. Field of the Invention

The present invention relates to a power amplifier circuit, and more particularly, to a power amplifier circuit capable of improving cross isolation between a high frequency band power coupler and a low frequency band power coupler, by directly transmitting power to the high frequency band power coupler and the low frequency band power coupler from a power amplifier, and forming a predetermined inductance circuit or an LC resonance circuit in a line transmitting the power to the high frequency band power coupler.

2. Description of the Related Art

Recently, an electronic device adopting a wireless communication circuit has been widely used due to the easy use and mobility thereof, and the advantageous installment and maintenance thereof.

The electronic device adopting this wireless communication circuit is representatively a mobile terminal, a personal digital assistance (PDA), or the like.

In the electronic device adopting this wireless communication circuit, a transceiver transmitting and receiving a signal containing information is employed.

In the transceiver, a power amplifier circuit amplifying the power of a signal which necessarily needs to be transmitted or a received signal is used.

The output signal of the power amplifier circuit is subjected to power coupling and impedance matching and transmitted to an antenna and a receiving circuit. As shown in FIG. 1, this power amplifier circuit may include a power amplifier 11 and a power coupler 12. Meanwhile, the power amplifier 11 and the power coupler 12 are integrated in a single substrate. In this case, the power amplifier 11 may be formed by a complementary metal oxide semiconductor (CMOS) process and the power coupler 12 may be formed by an integrated passive device (IPD) process.

In this structure, power supplied to the power amplifier 11 is transmitted to a high frequency band power coupler 12a and a low frequency band power coupler 12b of the power coupler 12 through an external power supply pad 13 and an external bonding wire 14. However, since the power amplifier 11 has a limitation in performing cross isolation capable of restricting the output in a high frequency band when the power amplifier 11 operates in a low frequency band, it may not satisfy with the demands of a user requiring the cross isolation of at least −20 dBm or less.

SUMMARY OF THE INVENTION

An aspect of the present invention provides a power amplifier circuit capable of improving cross isolation between a high frequency band power coupler and a low frequency band power coupler, by directly transmitting power to the high power coupler and the low frequency band power coupler from a power amplifier, and forming a predetermined inductance circuit or an LC resonance circuit in a line transmitting the power to the high frequency band power coupler.

According to an aspect of the present invention, there is provided a power amplifier circuit including: a power amplifying unit supplied with power from the outside and amplifying an input signal; a coupling unit having a high frequency band power coupler coupling the amplified signal in a predetermined high frequency band to a first output terminal to thereby output a predetermined first output signal, when the amplified signal from the power amplifying unit is in the predetermined high frequency band, and a low frequency band power coupler coupling the amplified signal in a predetermined low frequency band to a second output terminal to thereby output a predetermined second output signal, when the amplified signal from the power amplifying unit is in the predetermined low frequency band having a lower frequency than that in the high frequency band of the high frequency band power coupler; and an isolation unit including a first power line receiving the power from the power amplifying unit and transmitting the power to the high frequency band power coupler, and a second power line receiving the power from the power amplifying unit and transmitting the power to the low frequency band power coupler, wherein the first power line has an inductor blocking signal interference generated in a predetermined frequency band.

The power amplifying unit, the coupling unit, and the isolation unit may be configured as an integrated circuit on a single substrate having a predetermined mounting area.

The high frequency band power coupler and the low frequency band power coupler of the coupling unit may be disposed on the substrate to be spaced apart from each other by a predetermined distance.

The first power line and the second power line of the isolation unit are disposed to be spaced apart from each other by a predetermined distance within the distance between the high frequency band power coupler and the low frequency band power coupler.

The first power line may be formed as at least one first conductive pattern and the first conductive pattern may form the inductor by forming at least one loop.

The first power line may further include a capacitor connected in parallel to the inductor and forming an LC resonance filter blocking the signal interference in the frequency band.

The capacitor may be formed as at least one second conductive pattern, and may be disposed to be spaced apart from the first conductive pattern by a predetermined distance within the at least one loop.

The power amplifier circuit may further include a shielding unit having a conductive pattern spaced apart from the first power line and the second power line by a predetermined distance, on the first power line and the second power line of the isolation unit.

The high frequency band power coupler may include a first primary conductive pattern forming at least one loop and receiving the amplified signal from the power amplifying unit, and a first secondary conductive pattern forming at least one loop and electromagnetically coupling with the first primary conductive pattern to thereby output an output signal. The low frequency band power coupler may include a second primary conductive pattern forming at least one loop and receiving the amplified signal from the power amplifying unit, and a second secondary conductive pattern forming at least one loop and electromagnetically coupling with the second primary conductive pattern to thereby output an output signal. Wherein, the power amplifier circuit may further include a shielding unit having a conductive pattern disposed above the first primary conductive pattern and the first secondary conductive pattern in a portion in which the high frequency band power coupler and the low frequency band power coupler are adjacent to each other, or the second primary conductive pattern and the second secondary conductive pattern of the low frequency band power coupler, in such a manner as to be spaced apart therefrom by a predetermined distance.

The input signal may be a differential signal to be inputted to the power amplifying unit. The high frequency band power coupler may perform coupling upon an amplified differential signal in a predetermined high frequency band to thereby output a single signal, when the amplified differential signal from the power amplifying unit is in the predetermined high frequency band. The low frequency band power coupler may perform coupling upon an amplified differential signal in a predetermined low frequency band to thereby output a single signal, when the amplified differential signal from the power amplifying unit is in the predetermined low frequency band.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
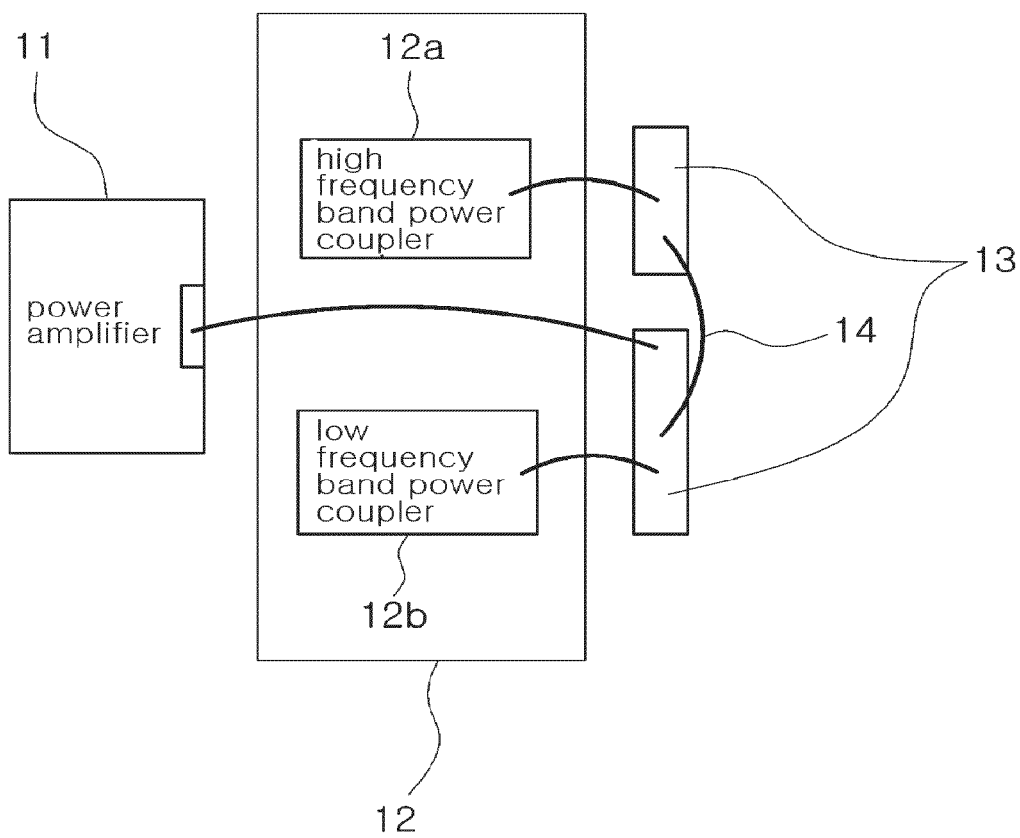
FIG. 1 is a schematic diagram of a power amplifier circuit according to the related art.

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. The same or equivalent elements are referred to by the same reference numerals throughout the specification.

Figure 2:
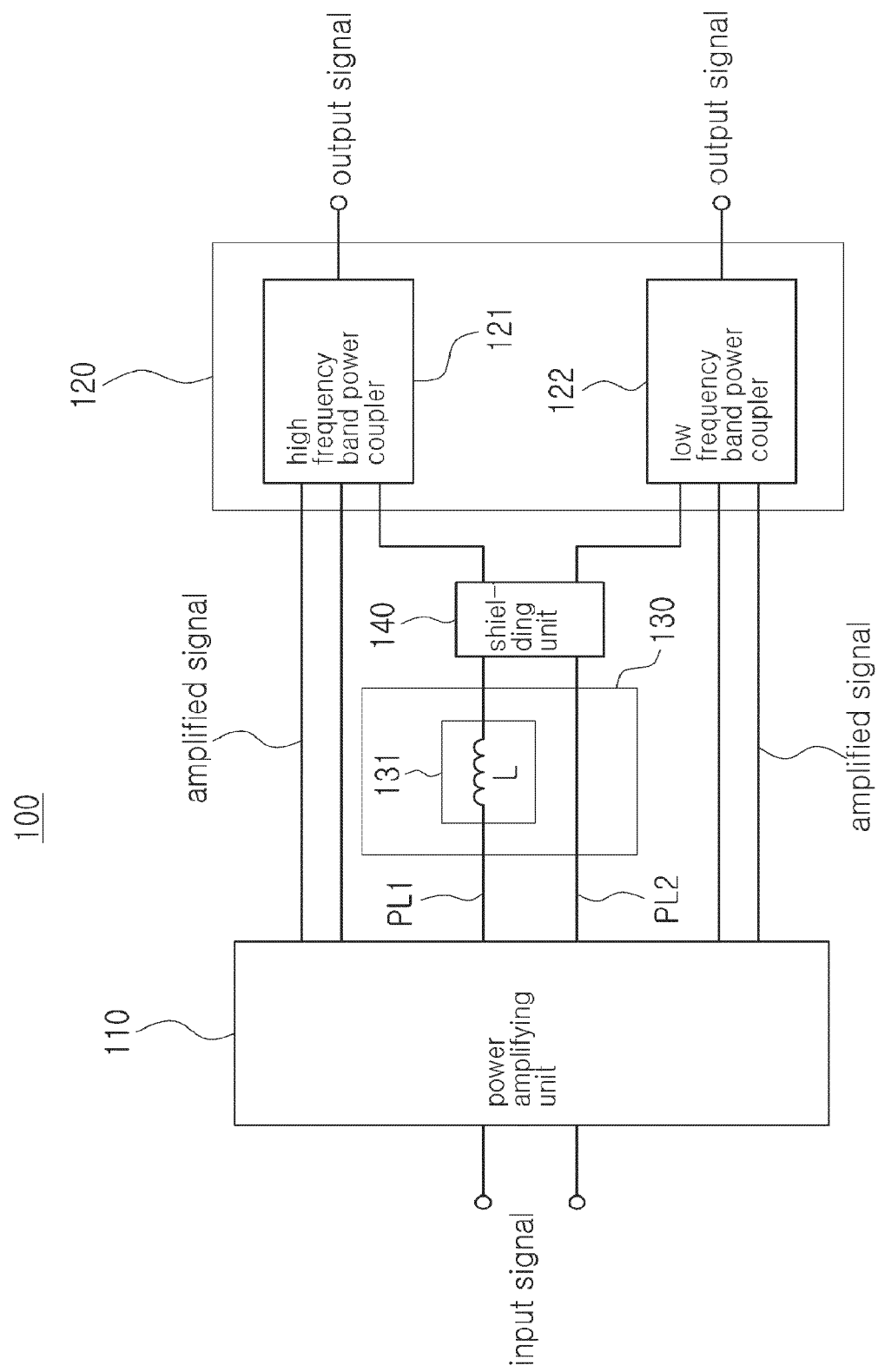
FIG. 2 is a schematic diagram of a power amplifier circuit according to an exemplary embodiment of the present invention.

FIG. 2 is a schematic diagram of a power amplifier circuit according to an exemplary embodiment of the present invention. In FIG. 2, a power amplifier circuit 100 according to this exemplary embodiment of the present invention may include a power amplifying unit 110, a coupling unit 120, and an isolation unit 130, and may further include a shielding unit 140.

The power amplifying unit 110 may be supplied with power from the outside and amplify the level of an input signal depending on a preset gain. The input signal may be a differential signal, and the power amplifying unit 110 may amplify the differential signal and output the amplified differential signal. At this time, the amplified differential signal may be transmitted to a high frequency band power coupler 121 or a low frequency band power coupler 122 of the coupling unit 120 depending on a frequency band.

As set forth above, the coupling unit 120 may include the high frequency band power coupler 121 and the low frequency band power coupler 122. When the amplified differential signal from the power amplifying unit 110 is a signal in a high frequency band which has been previously set to have a high frequency, the high frequency band power coupler 121 may output the signal in the high frequency band as a single signal through coupling, via a first output terminal. When the amplified differential signal from the power amplifying unit 110 is a signal in a low frequency band which has been previously set to have a lower frequency than that in the high frequency band, the low frequency band power coupler 122 may output the signal in the low frequency band as a single signal through coupling, via a second output terminal. Meanwhile, the high frequency band power coupler 121 and the low frequency band power coupler 122 of the coupling unit 120 may receive external power from the power amplifying unit 110.

The isolation unit 130 may include a first power line PL1 and a second power line PL2, and a blocking unit 131 blocking frequency interference.

The first power line PL1 may transmit the power transmitted to the power amplifying unit 110 to the high frequency band power coupler 121. The second power line PL2 may transmit the power transmitted to the power amplifying unit 110 to the low frequency band power coupler 122.

The blocking unit 131 may include an inductor L to block signal interference in a predetermined frequency band during the operation of the low frequency band power coupler 122.

The shielding unit 140 may be spaced apart from the first power line PL1 and the second power line PL, or the high frequency band power coupler 121 and the low frequency band power coupler 122 by a predetermined distance, and shield the even order harmonic component of the outputted signal.

Figure 3:
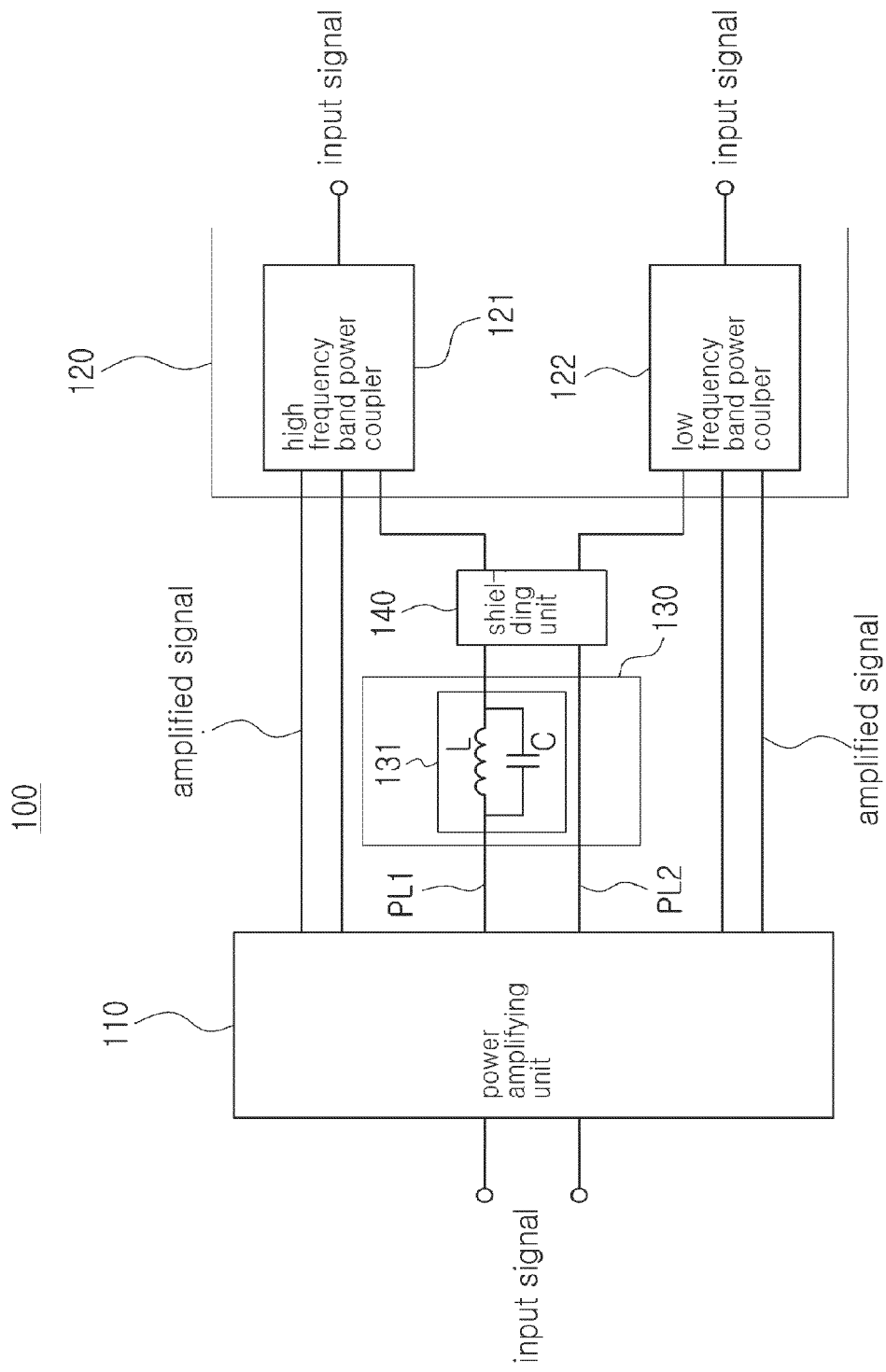
FIG. 3 is a diagram schematically showing an example of an isolation unit adopted in a power amplifier circuit according to an exemplary embodiment of the present invention.

FIG. 3 is a diagram schematically showing an example of an isolation unit adopted in a power amplifier circuit according to an exemplary embodiment of the present invention.

Referring to FIG. 3, the blocking unit 131 may include an LC resonance filter configured to have the inductor L and a capacitor C connected in parallel to the inductor L in order to block the signal interference in the predetermined frequency band during the operation of the low frequency band power coupler 122. Other components are identical to components shown in FIG. 2, and thus their description will be omitted.

Figure 4:
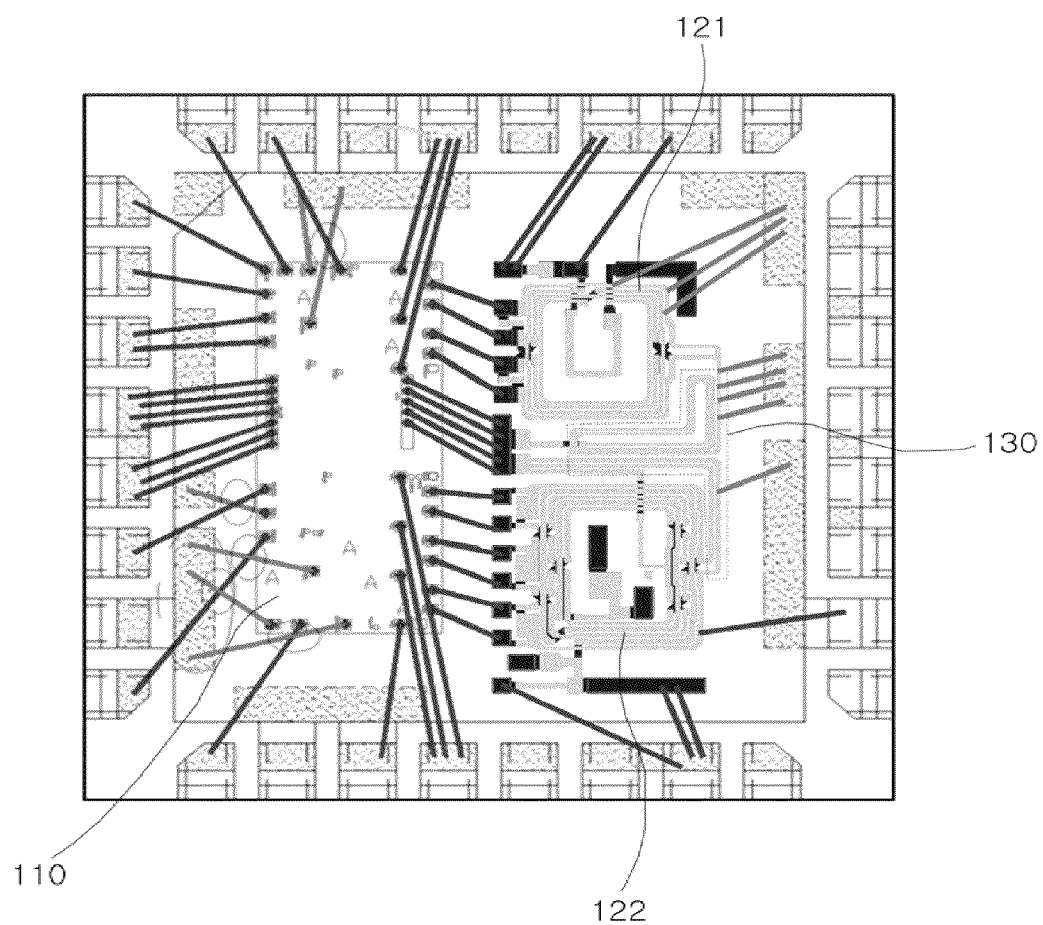
FIG. 4 illustrates an example of a schematic layout when a power amplifier circuit according to an exemplary embodiment of the present invention is configured as a single IC.

FIG. 4 is a schematic diagram when a power amplifier circuit according to an exemplary embodiment of the present invention is configured as a single IC.

Referring to FIG. 4, along with FIG. 2, the power amplifier circuit 100 according to an exemplary embodiment of the present invention may be formed on a substrate A having a predetermined mounting area and configured as a single IC chip. The power amplifying unit 110 is disposed in a portion of the mounting area on the substrate A, and the coupling unit 120 is disposed adjacent to the power amplifying unit 110. At this time, the high frequency band power coupler 121 and the low frequency band power coupler 122 of the coupling unit 120 are spaced apart from each other by a predetermined distance. The isolation unit 130 may be disposed within the predetermined distance between the high frequency band power coupler 121 and the low frequency band power coupler 122.

Through the above configuration, while an IC chip according to the related art may have 5 mm×5 mm dimensions because of a conductive pad and a bonding wire transmitting power, the IC chip according to this exemplary embodiment of the present invention may be disposed within the distance between the high frequency band power coupler 121 and the low frequency band power coupler 122, thereby the reducing dimensions thereof to 4 mm×4 mm.

Figure 5A:
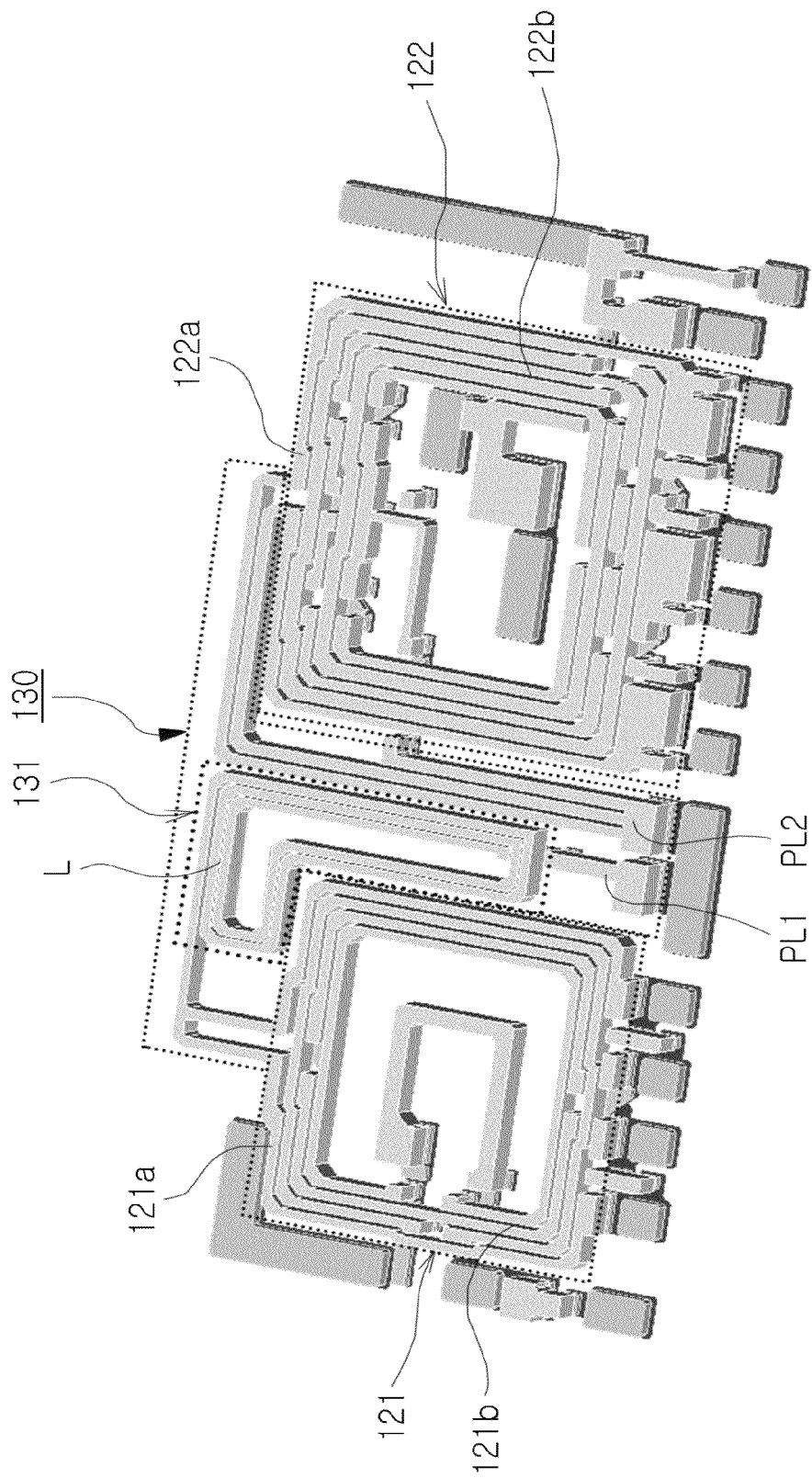
FIGS. 5A and 5B individually illustrate an example of a schematic layout when a coupling unit and an isolation unit adopted in a power amplifier circuit according to an exemplary embodiment of the present invention are configured in a single IC chip.
Figure 5B:
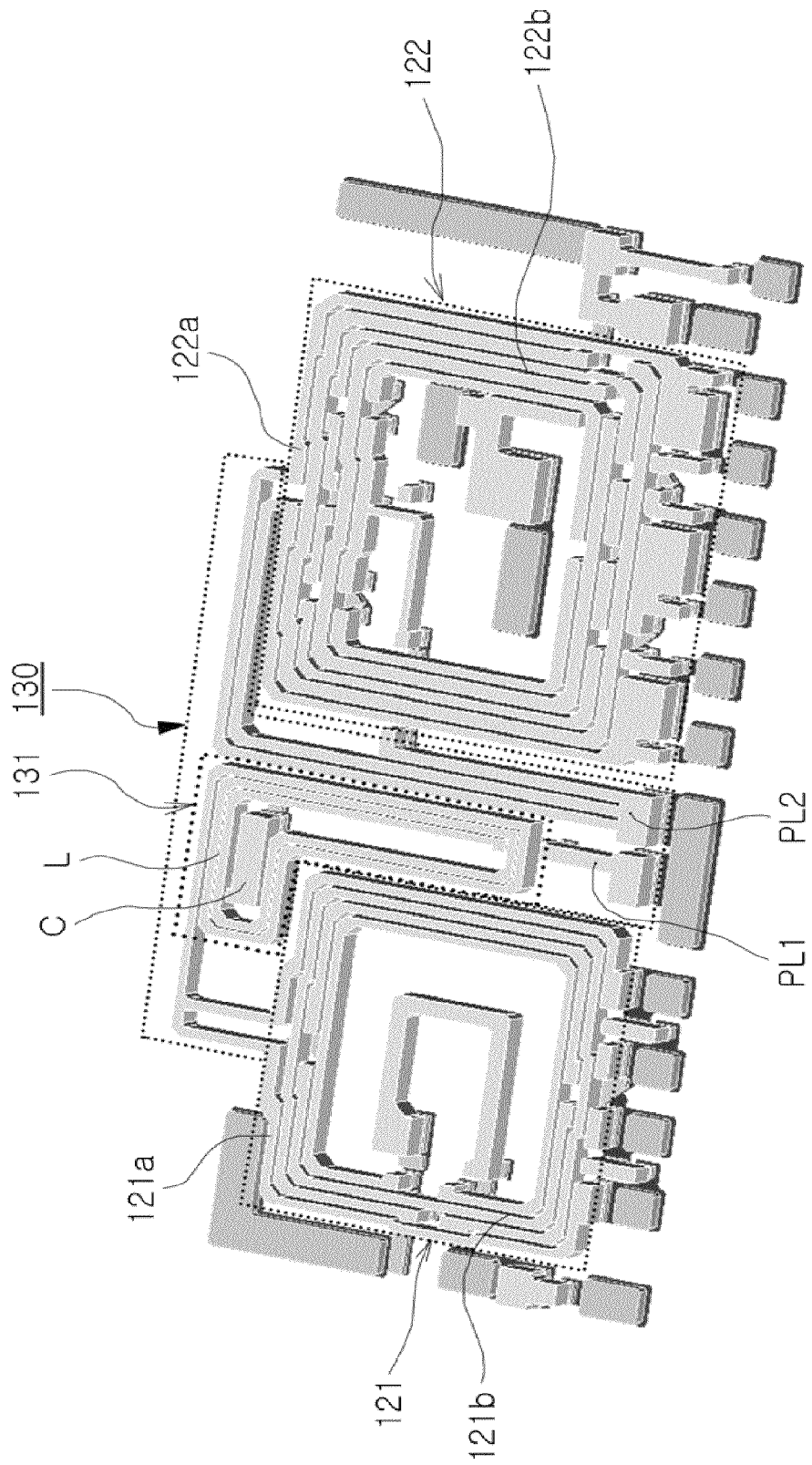

FIGS. 5A and 5B individually illustrate an example of a schematic layout when a coupling unit and an isolation unit adopted in a power amplifier circuit according to an exemplary embodiment of the present invention are configured in a single IC chip.

FIG. 5A illustrates an example of a schematic layout when the coupling unit and the isolation unit adopted in the power amplifier circuit shown in FIG. 2 are configured in the single IC chip. FIG. 5B illustrates an example of a schematic layout when the coupling unit and the isolation unit adopted in the power amplifier circuit shown in FIG. 3 are configured in the single IC chip.

Referring to FIG. 5A, the high frequency band power coupler 121 may include a first primary conductive pattern 121a made of a conductor having a predetermined length and forming a least one loop to thereby receive the differential signal from the power amplifying unit 110, and a first secondary conductive pattern 121b made of a conductor having a predetermined length and forming at least one loop to thereby output the single signal by electromagnetic coupling with the first primary conductive pattern 121a.

In the same manner, the low frequency band power coupler 122 may include a second primary conductive pattern 122a made of a conductor having a predetermined length and forming a least one loop to thereby receive the differential signal from the power amplifying unit 110, and a second secondary conductive pattern 122b made of a conductor having a predetermined length and forming at least one loop to thereby output the single signal by electromagnetic coupling with the second primary conductive pattern 122a.

The isolation unit 130 may be disposed within the distance between the high frequency band power coupler 121 and the low frequency band power coupler 122. The first power line PL1 and the second power line PL2 are made of a conductor having a predetermined length and spaced apart from each other by a predetermined distance, thereby being capable of individually transmitting power to the first primary conductive pattern 121a or the second primary conductive pattern 122a.

The conductor of the first power line PL1 may form the inductor L by obtaining a distance sufficient to block signal interference in a predetermined frequency band through the formation of at least one loop.

Referring to FIG. 5B, the conductor of the first power line PL1 may form the inductor L by obtaining the distance sufficient to block the signal interference in the predetermined frequency band through the formation of the at least one loop.

Other components are identical to components shown in FIG. 5A, and thus their description will be omitted.

Figure 6A:
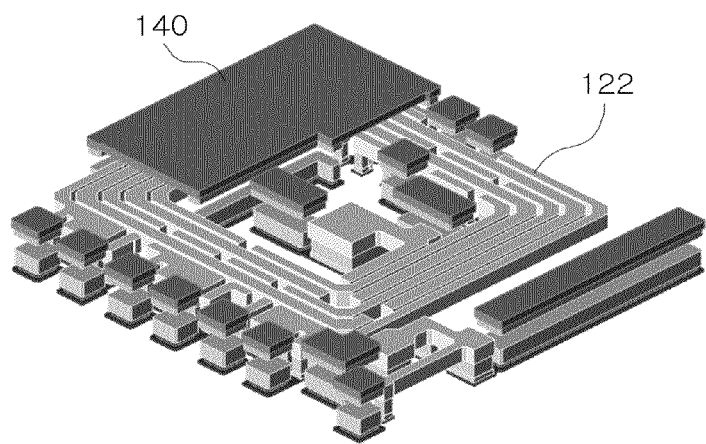
FIGS. 6A and 6B individually illustrate an example of a schematic layout when a blocking unit adopted in a power amplifier circuit according to an exemplary embodiment of the present invention is configured in a single IC chip, together with a coupling unit and an isolation unit.
Figure 6B:
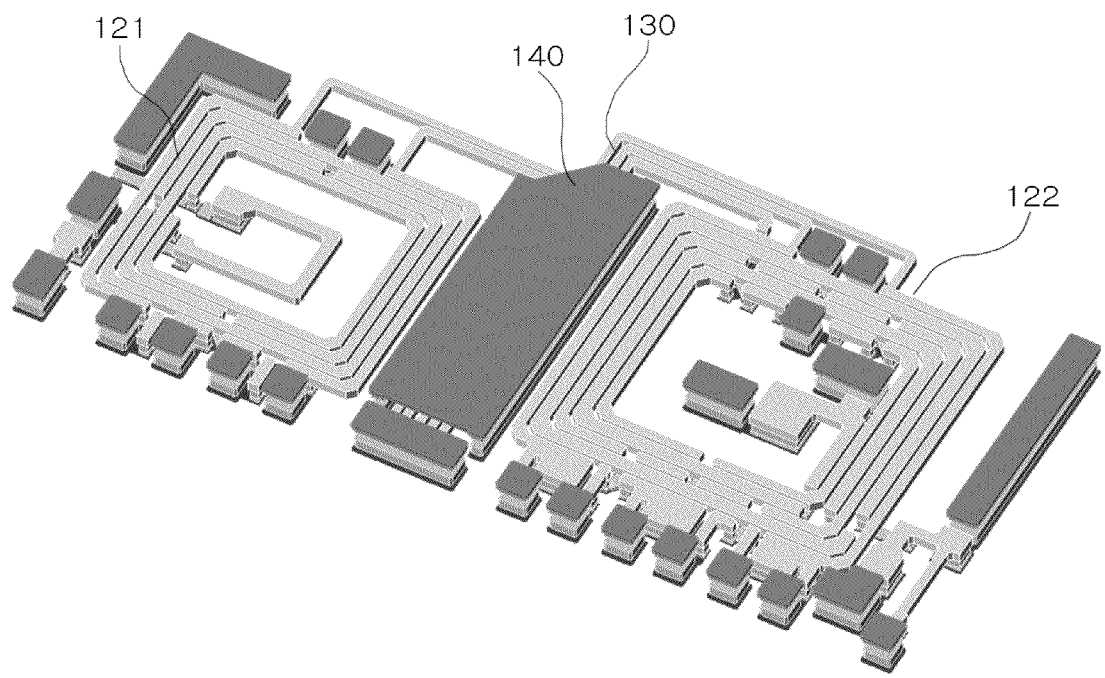

FIGS. 6A and 6B illustrate an example of a schematic layout when a blocking unit adopted in a power amplifier circuit according to an exemplary embodiment of the present invention is configured in a single IC chip, together with a coupling unit and an isolation unit.

Referring to FIG. 6A, the shielding unit 140 is disposed above the second primary conductive pattern and the second secondary conductive pattern in a portion in which the high frequency band power coupler and the low frequency band power coupler 122 are adjacent to each other, in such a manner as to be spaced apart therefrom by a predetermined distance. While not illustrated, the shielding unit 140 may, however, be disposed above the first primary conductive pattern and the first secondary conductive pattern of the high frequency band power coupler, in such a manner as to be spaced apart therefrom by a predetermined distance. The shielding unit 140 may suppress signal interference between the power line, transmitting the power to the high frequency band power coupler or the low frequency band power coupler 122, and the primary and secondary conductive patterns. Accordingly, secondary or quaternary or more, the even order harmonic components of the outputted signal may be suppressed.

Referring to FIG. 6B, the shielding unit 140 may be disposed above the first power line PL1 and the second power line PL2, in such a manner as to be spaced apart therefrom by a predetermined distance. The shielding unit 140 may suppress the signal interference between the power line transmitting the power to the high frequency band power coupler or the low frequency band power coupler 122, and the primary and secondary conductive patterns. Accordingly, secondary or quaternary or more, the even order harmonic component of the outputted signal may be suppressed.

Figure 7:
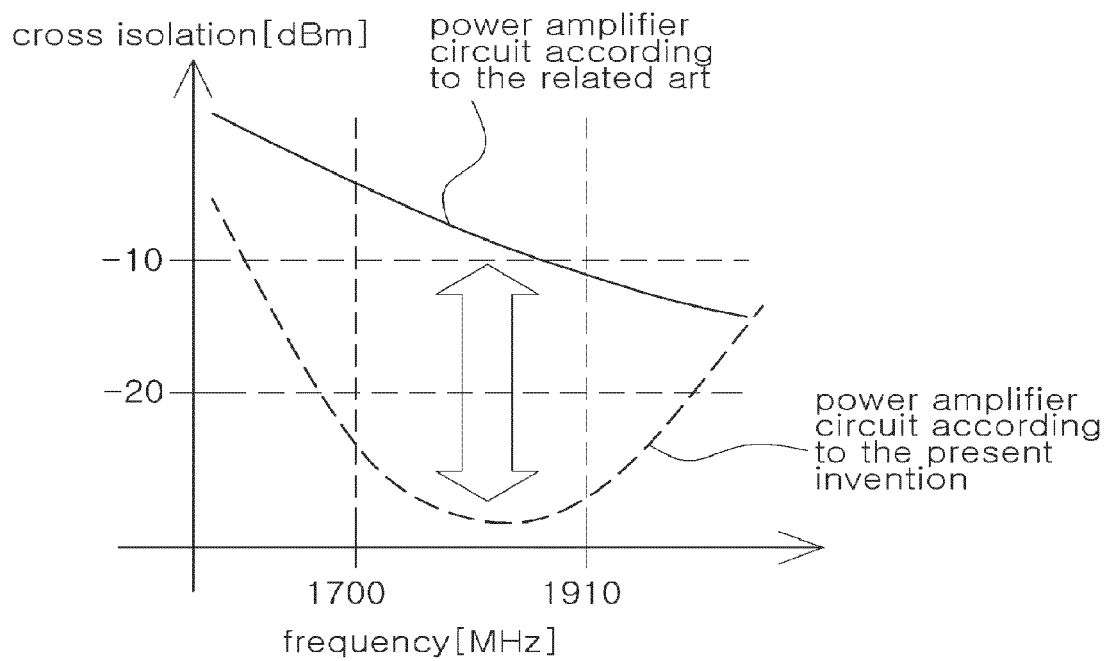
FIG. 7 illustrates cross isolation graphs shown by a power amplifier circuit according to the related art and a power amplifier circuit according to the present invention.

FIG. 7 illustrates cross isolation graphs shown by a power amplifier circuit according to the related art and a power amplifier circuit according to the present invention.

Referring to FIG. 7, as compared to the power amplifier circuit according to the related art, the power amplifier circuit according to an exemplary embodiment of the present invention may satisfy with the demands of a user requiring the cross isolation of −20 dBm between the high frequency band power coupler and the low frequency band power coupler by directly transmitting the power to the high frequency band power coupler and the low frequency band power coupler from the power amplifier, and forming a predetermined inductance circuit or an LC resonance circuit in the line transmitting the power to the high frequency band power coupler.

As set forth above, according to exemplary embodiments of the invention, there is provided a power amplifier circuit capable of improving cross isolation between a high frequency band power coupler and a low frequency band power coupler, by directly transmitting power to the high frequency band power coupler and the low frequency band power coupler from a power amplifier, and forming a predetermined inductance circuit or an LC resonance circuit in a line transmitting the power to the high frequency band power coupler.

While the present invention has been shown and described in connection with the exemplary embodiments, it will be apparent to those skilled in the art that modifications and variations can be made without departing from the spirit and scope of the invention as defined by the appended claims.

What is claimed is:

1. A power amplifier circuit, comprising:
a power amplifying unit configured to receive power from an outside and to amplify an input signal;
a coupling unit having
a high frequency band power coupler configured to couple the amplified signal in a predetermined high frequency band to a first output terminal to thereby output a predetermined first output signal, when the amplified signal from the power amplifying unit is in the predetermined high frequency band, and a low frequency band power coupler configured to couple the amplified signal in a predetermined low frequency band to a second output terminal to thereby output a predetermined second output signal, when the amplified signal from the power amplifying unit is in the predetermined low frequency band having a lower frequency than that in the high frequency band of the high frequency band power coupler; and an isolation unit including a first power line configured to receive the power from the power amplifying unit and to transmit the power to the high frequency band power coupler, and a second power line configured to receive the power from the power amplifying unit and to transmit the power to the low frequency band power coupler, wherein the first power line has an inductor configured to block signal interference generated in a predetermined frequency band, the power amplifying unit, the coupling unit, and the isolation unit are configured as an integrated circuit on a single substrate having a predetermined mounting area, the high frequency band power coupler and the low frequency band power coupler of the coupling unit are disposed on the substrate to be spaced apart from each other by a predetermined distance, the first power line and the second power line of the isolation unit are disposed to be spaced apart from each other and within the distance between the high frequency band power coupler and the low frequency band power coupler, the high frequency band power coupler comprises a first primary conductive pattern forming at least one loop and configured to receive the amplified signal from the power amplifying unit, and a first secondary conductive pattern forming at least one loop and electromagnetically coupling with the first primary conductive pattern to thereby output an output signal, the low frequency band power coupler comprises a second primary conductive pattern forming at least one loop and configured to receive the amplified signal from the power amplifying unit, and a second secondary conductive pattern forming at least one loop and electromagnetically coupling with the second primary conductive pattern to thereby output an output signal, and the power amplifier circuit further comprises a shielding unit having a conductive pattern which is disposed above, while being spaced apart from, the first primary conductive pattern and the first secondary conductive pattern in a portion in which the high frequency band power coupler and the low frequency band power coupler are adjacent to each other, or disposed above, while being spaced apart from, the second primary conductive pattern and the second secondary conductive pattern of the low frequency band power coupler.

2. The power amplifier circuit of claim 1, wherein the first power line includes at least one first conductive pattern and the first conductive pattern includes at least one loop that forms the inductor.

3. The power amplifier circuit of claim 2, wherein the first power line further comprises a capacitor connected in parallel to the inductor and forming an LC resonance filter for blocking the signal interference in the predetermined frequency band.

4. The power amplifier circuit of claim 3, wherein the first power line further includes at least one second conductive pattern, which forms the capacitor and is spaced apart from the first conductive pattern within the at least one loop.

5. The power amplifier circuit of claim 1, wherein the input signal is a differential signal to be inputted to the power amplifying unit, the high frequency band power coupler is configured to perform coupling upon an amplified differential signal in the predetermined high frequency band to thereby output a single signal, when the amplified differential signal from the power amplifying unit is in the predetermined high frequency band, and the low frequency band power coupler is configured to perform coupling upon an amplified differential signal in the predetermined low frequency band to thereby output a single signal, when the amplified differential signal from the power amplifying unit is in the predetermined low frequency band.

6. The power amplifier circuit of claim 1, further comprising a shielding unit having a conductive pattern spaced apart from the first power line and the second power line by a predetermined distance, on the first power line and the second power line of the isolation unit.

* * * * *